United States Patent [19]

Konantz et al.

[11] 3,860,448

[45] Jan. 14, 1975

[54] METHOD OF APPLYING SILICONE PASSIVANTS TO ETCH MOATS IN MESA DEVICE WAFERS

[75] Inventors: Mark L. Konantz; Ronald K. Leisure, both of Kokomo, Ind.

[73] Assignee: General Motors Corporation, Detroit, Mich.

[22] Filed: Apr. 25, 1973

[21] Appl. No.: 354,220

[52] U.S. Cl. ............. 117/212, 117/10, 117/132 BS, 117/37 R

[51] Int. Cl. ............................ B44d 1/18, B44c 1/02

[58] Field of Search ............ 117/132 BS, 37 R, 212, 117/10

[56] References Cited

UNITED STATES PATENTS 3,002,848 10/1961 Clark .................................. 117/10

*Primary Examiner*—John D. Welsh

*Attorney, Agent, or Firm*—R. J. Wallace

[57] ABSTRACT

A method of selectively applying a silicone elastomer passivant to a plurality of etch moats in a major surface of a semiconductor wafer. The passivant in viscous form is spread as a blanket coating over the entire surface of the wafer. The coating is then covered with a flexible, porous sheet. The passivant is partially cured so that the adhesion between the passivant and the etch moats is greater than the cohesive strength of the passivant. The porous sheet is then pulled away from the wafer, taking with it the blanket coating and leaving the passivant in the etch moats.

3 Claims, No Drawings

METHOD OF APPLYING SILICONE PASSIVANTS TO ETCH MOATS IN MESA DEVICE WAFERS

BACKGROUND OF THE INVENTION

This invention relates to a method of applying passivants to semiconductor devices. More particularly, it involves a method of applying silicone passivants to PN junctions exposed in at etch moat on a major surface of a semiconductor wafer.

It is well known within the art that exposed PN junctions of a semiconductor device increase the probability of failure of the device under conditions of high reverse operating voltages. To insure stability of the electrical characteristics of these devices, it is customary to protect the exposed junctions from contaminants which would impair device characteristics.

Several methods of protecting, or passivating, the exposed junctions of semiconductor devices have been employed. Some of the methods used include the formation of an oxide layer over the junctions, encapsulating the device with various plastics, and coating the exposed junctions with particular groups of glasses. Furthermore, in some methods each discrete device is separately passivated, which is a time consuming production procedure.

It has been recognized that an annular recess, or etch moat, can be used to avoid having a collector-base junction of a transistor chip terminate at a chip edge. In such instance, the annular etch moat circumscribes the emitter region and base contact of a mesa device and extends down through the collector-base junction. This configuration is described in the pending U.S. Pat. application Ser. No. 300,207 Harland et al., filed Oct. 24, 1972, and assigned to the assignee of this invention now U.S. Pat. No. 3,821,780. While this configuration provides an improved device, it can be improved even further if the junction exposed in the etch moat is passivated. It has been proposed to fill it with a semiconductor grade silicone rubber. However, it is difficult and expensive to apply the silicone rubber to the etch moat before device assembly is completed when the moats are small and surround mesa emitters. One cannot just coat the entire surface and then squeeze off the excess. The primary method of passivating these devices was to place a blob of soft varnish or plastic over each device after it has been mounted on a package base and filamentary wires have been connected to the various regions of the device. However, in this method the device is not passivated directly after the junction is initially exposed, thus contaminants may collect in the etch moats during subsequent processing and before passivation, and impair the electrical characteristics of the device.

We have found an easy and reliable method for selectively applying a silicone passivant to the etch moats of a plurality of devices on a single wafer simultaneously, and directly after the etch moats are formed. Hence, passivation no longer need wait until after device assembly. It can be done even before the wafers are diced into chips.

SUMMARY OF THE INVENTION

It is therefore an object of this invention to provide a unique and simple method of selectively applying passivants to semiconductor wafer etch moats with exposed PN junctions.

It is a further object of this invention to provide an easy and reliable method of simultaneously passivating a plurality of etch moats on a single wafer before the wafer is completely processed.

These and other objects of this invention are accomplished by covering a major surface of a semiconductor wafer containing a plurality of etch moats therein with a semiconductor grade silicone elastomer passivant in an uncured liquid form. A flexible, porous sheet is then placed on the blanket coating of passivant. The elastomer passivant is then partially cured, and the sheet pulled away from the wafer. This pulls away all of the passivant except for the passivant adhering to the etch moats. The passivant remaining in the etch moats is then completely cured.

DESCRIPTION OF THE PREFERRED EMBODIMENT

As previously described, this invention can be used to selectively simultaneously apply a silicone elastomer passivant to a plurality of etch moats on a single wafer. A wafer containing a plurality of devices such as described in the aforementioned U.S. application Ser. No. 300,207 Harland et al. would contain a plurality of etch moats, with each etch moat surrounding each active device.

One may practice this invention, for example, on a circular silicon wafer about 1.3 inches in diameter containing twenty or more discrete mesa devices. The wafer has two parallel major surfaces. One major surface is formed by a first wafer stratum of one conductivity type. A second wafer stratum of opposite conductivity type that is contiguous the first stratum forms the opposite surface of the wafer. The first stratum is about 1 mil thick and serves as a common base region for the device on the wafer. The second stratum is about 5 mils thick and serves as a common collector region for the device. The interface between the base region and the collector region forms a PN junction. A plurality of emitter mesas upstand on the base region face of the wafer for each device. The emitter mesas are of an opposite conductivity type and form a PN junction with the base stratum that underlies and surrounds it. Each mesa is about 0.02 square inches and extends approximately 0.5 mils from the base region face.

To prepare the wafer, it is first treated to rid the wafer of any contaminants. The wafer is submersed in boiling trichloroethylene for approximately 2 minutes. The wafer is then baked for 45 minutes at 150° C in room air. Within one hour of the cleaning operation, a photoresist, such as KMER, is applied to the major surface of the wafer having the emitter mesas thereon. The wafer is then baked again, at approximately 100° C for 1 hour in room air.

A conventional photomask is placed on the KMER coated major surface of the wafer. The mask, which is typically used in the art, has two major parallel faces and is of transparent material with an opaque design on selected portions of one face. The KMER coated major surface of the wafer with the photomask thereon is subjected to an ultraviolet light for approximately twenty seconds. An unexposed annulus of KMER circumscribes each discrete mesa emitter. It should be noted that if the devices contain more than one mesa emitter such as in a Darlington integrated circuit, the unexposed annulus would circumscribe both emitters inclusively. The wafer is then developed and again baked at 100° C in room air for approximately 1 hour.

The wafer is then placed on a flat surface such as a table with the KMER coated surface of the wafer face down. The opposite surface or collector side of the wafer is sprayed with suitable maskant such as Apiezon wax distributed by the Shell Oil Company and is mounted on a wax-coated glass slide. Photoresist may also be used as a substitute therefor.

The wafer is then submerged in an etchant for approximately 4 minutes. A typical etchant that is preferred contains five parts nitric acid, three parts acetic acid, and three parts hydrofluroic acid. After etching, the wafer is rinsed with deionized water to ensure that the wafer is free of the etchant. It should be noted that this etching process forms a plurality of etch moats corresponding to the unexposed areas on the major surface of the wafer. Each moat is approximately eight mils wide and 2 – 3 mills deep. The etch moat extends from the base region face of the wafer, down through the collector-base PN junction, and into the collector region. Hence, these etch moats expose the collector-base junction.

A semiconductor grade silicone elastomer, such as that distributed by Transene Company, Inc., under the trade name "Silicone Elastomer for Semiconductors," is poured onto the KMER coating and into the etch moats within the KMER openings. The elastomer is a thick, white, liquid processed from highly purified siloxane derivative, partially condensed and polymerized. A common form of this passivant is used with an addition of a trace of a catalyst to cure it at a selected lower temperature. Curing converts the liquid to produce a solid silicone elastomer having excellent electrical and physical properties. It should be noted that the silicone passivant is in viscous fluid form directly after the addition of the catalyst and it will not become solid until after it has been completely cured.

The chemical formula for such an elastomer shows a covalent bonding of all elements without free dangling valance bonds and in general a nonpolar molecular structure such as shown below:

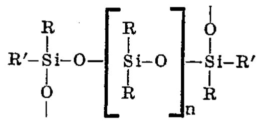

The silicone passivant adheres well to silicon, and has a typical viscosity of 12,500 cps for the uncatalyzed product.

It should be noted that although the Silicone Elastomer for Semiconductors is preferred, Room Temperature Vulcanizable rubber (RTV) distributed by General Electric can also be used for the silicone elastomer passivant.

The wafer with the blanket coating of silicone passivant thereon is then placed in a vacuum chamber with greater than 25 inches mercury vacuum for approximately 15 minutes. This is to rid the passivant of any air bubbles.

A silk cloth, such as that used for polishing semiconductor wafers, approximately 1½ inch square is placed on the elastomer coating on the surface of the wafer. The silk cloth may be that distributed by Buehler, Limited, and designated as Type AB Polishing Cloth. A medical gauze such as may be used in typical medical functions may serve as a substitute for the silk cloth. The cloth partially sinks through the passivant on the wafer surface due to its porosity.

The wafer with the passivant and silk cloth thereon is placed in an oven for 45 minutes at 65° C, ± 3° C, and 66% relative humidity (RH), ± 4% RH, in room air. This partial cure creates an adhesive bond between the silicone passivant and the silicon walls defining the etch moats that is greater than the internal cohesion of the silicone passivant itself. It should be noted that the walls of the etch moats are somewhat rough due to the etching process in which the etch moats were produced. This rough surface also facilitates a good adhesive bond between the passivant and the etch moats. This partial cure also creates adhesive bonding between the silk cloth and the passivant that similarly has a strength greater than the cohesive strength within the passivant. A wide variety of methods can be employed to obtain this partial cure as temperature, time, and atmosphere are all factors which determine this characteristic. For example, partial cure may be had at room air and temperature (27° C) in 12 hours. Similarly, it may be had at 65° C for 2 hours, also with room air. A further method of partially curing the silicone passivant is by heating it to 55° C, in an atmosphere in which nitrogen ($N_2$) has been bubbled through de-ionized water. The time of this method has been varied successfully from 40 minutes to 2 hours. The passivant, after this partial curing step, is in a semi-solid, flexible condition.

After the partial curing step, the silk cloth is manually pulled away from the wafer surface. Since the partial curing insured that there is a good adhesive bond between the silicone passivant and the etch moats, the passivant will adhere to the silicon walls defining the etch moats. The remainder of the blanket coating of silicone passivant clings to the silk cloth and is removed from the wafer face.

As should now be evident, the previously exposed collector-base PN junction within the etch moats are now coated with the silicone elastomer passivant. The passivant forms a continuous coating completely lining the plurality of etch moats, thereby protecting the PN junction from contamination during further processing.

The wafers are then removed from the glass slide and rinsed in trichloroethylene until the wax is dissolved. The KMER photoresist is removed from the major surface of the wafer by brushing the face with trichloroethylene. To insure further wax and KMER photoresist removal, the wafer may be subjected to further trichloroethylene rinses and an ultrasonic bath of trichloroethylene for approximately 30 – 45 seconds.

Finally, the silicone passivant is completely cured to form a solid substance by following the recommended procedure of the manufacturer. This complete or final cure is obtained by gradual heating or by step heating in an air bake oven. The recommended procedure for Silicone Elastomer for Semiconductors of Transene Company, Inc., for completely curing is as follows:

1. 2 hours at 65° C
2. 2 hours at 110° C
3. 12 hours at 175° C
4. 4 hours at 200° C It should be understood that variations of this particular example lie within the scope of this invention. As hereinbefore mentioned, medical gauze can be substituted for the silk cloth. In fact, any porous, flexible sheet having similar characteristics may be used. Furthermore, the condition for the partial and final curing steps may be altered so long as the desired characteristics are obtained for each step. It should be noted that this invention can be used for passivating planar devices as well as those having mesa emitters.

Several wafers may be processed at the same time. For example, before etching the etch moats therein, a plurality of wafers may be placed side by side mounted on a glass slide support so that a face opposite the major surface containing the etch moats is contiguous the support. The silicone elastomer passivant can be poured over each wafer so that their major surfaces containing the etch moats are all entirely covered. A unitary silk cloth is then placed on this blanket coating of passivant so that the cloth entirely covers all the wafers. Then the passivant is partially cured. The cloth is then pulled from the wafers, leaving the passivant only in the etch moats in the major surfaces of the wafers. The final cure is the same as hereinbefore mentioned.

Therefore, although this method has been described in connection with a particular example thereof, no limitation is intended thereby except as defined in the appended claims.

It is claimed:

1. A method of simultaneously selectively applying a silicone elastomer passivant lining to a plurality of etch moats in a major surface of a silicon semiconductor wafer, said method comprising the steps of:

applying a liquid blanket coating of uncured silicone elastomer passivant to a major surface of a silicon semiconductor wafer having a plurality of etch moats therein to which said silicone elastomer passivant will adhesively bond upon partial curing;

placing on said silicone elastomer passivant blanket coating a flexible, porous sheet to which said silicone elastomer passivant will adhesively bond upon partial curing;

partially curing the entirety of said silicone elastomer passivant blanket coating to produce cohesive strength in said coating and adhesive bonds between said coating and each of said sheet and said etch moats, said adhesive bonds having a strength greater than said cohesive strength;

pulling said sheet and an adherent blanket layer of partially cured passivant away from said wafer surface to remove said partially cured coating as a continuous blanket, while leaving portions of said blanket interfacing with said wafer surface as a continuous coating of partially cured silicone elastomer passivant completely lining each of said etch moats; and thereafter, completing the cure of said lining of partially cured silicone elastomer passivant left within said etch moats.

2. A method of applying a silicone elastomer passivant lining to a major surface of a silicon semiconductor wafer having a plurality of discrete devices included therein in which each of said devices has an emitter mesa upstanding on said major surface, said method comprising the steps of:

coating said major surface with a masking layer that defines a plurality of annular areas circumscribing each mesa emitter;

etching said areas in said wafer major surface to produce etch moats that extend down through a collector-base PN junction;

applying a liquid blanket coating of uncured silicone elastomer passivant to said etch moats and said masking layer wherein the silicone elastomer passivant will adhesively bond to said etch moats upon partial cure;

placing on said silicone elastomer passivant blanket coating a layer of fabric to which said silicone elastomer passivant will adhesively bond upon partial curing, wherein said fabric layer completely overlies said wafer;

heating to partially cure the entirety of said silicone elastomer passivant blanket coating to produce cohesive strength in said coating but so that the coating has a greater adherence to said etch moats and said fabric layer than cohesive strength;

pulling said fabric layer and an adherent blanket layer of partially cured silicone elastomer passivant away from said wafer surface to remove said partially cured coating as a continuous blanket, while leaving portions of said blanket interfacing with said wafer surface as a continuous coating of partially cured silicone elastomer passivant completely lining each of said etch moats; and thereafter, heating to completely cure said lining of partially cured silicone elastomer passivant left within said etch moats.

3. A method of simultaneously applying a silicone elastomer passivant lining to etch moats in a major surface of a plurality of silicon semiconductor wafers, said semiconductor wafers having a plurality of discrete devices included therein in which each of said devices has an emitter mesa upstanding on said major surface and an etch moat circumscribing each emitter mesa, said method comprising the steps of:

juxtaposing a plurality of silicon semiconductor wafers on a generally flat support so that a surface opposite said major surface containing said etch moats is contiguous said support;

applying a liquid blanket coating of uncured silicone elastomer passivant to said major surfaces of said wafers wherein said passivant will adhesively bond to said etch moats upon partial curing;

placing on said blanket coating of passivant a silk cloth to which said passivant will adhesively bond upon partial cure, whereby said cloth completely overlies said wafers;

partially curing the entirety of said passivant blanket coating to produce cohesive strength in said passivant coating but so that the passivant coating has a greater adherence to said etch moats and said silk cloth than cohesive strength;

pulling said silk cloth and an adherent blanket layer of partially cured silicone elastomer passivant away from said plurality of wafer surfaces to remove said partially cured passivant coating as a continuous blanket, while leaving portions of said blanket interfacing with said wafer surfaces as a continuous coating of partially cured silicone elastomer passivant completely lining each of said etch moats; and thereafter, completing the cure of said lining of partially cured silicone elastomer passivant left within said etch moats.

* * * * *